United States Patent [19]

Tanoi

[11] Patent Number: 5,046,071
[45] Date of Patent: Sep. 3, 1991

[54] COMMUNICATION SYSTEM CAPABLE OF IMPROVING TRANSMISSION EFFICIENCY BY CLASSIFYING A BLOCK SEQUENCE INTO SIGNIFICANT AND LESS SIGNIFICANT BLOCKS

[75] Inventor: Toshiyuki Tanoi, Tokyo, Japan

[73] Assignee: NEC Corporation, Japan

[21] Appl. No.: 384,545

[22] Filed: Jul. 24, 1989

[30] Foreign Application Priority Data

Jul. 23, 1988 [JP] Japan ................................ 63-182816

[51] Int. Cl.⁵ .......................................... H04B 14/06
[52] U.S. Cl. ...................................... 375/27; 358/135
[58] Field of Search .................... 375/27, 28; 358/133, 358/135, 136; 341/200, 76

[56] References Cited

U.S. PATENT DOCUMENTS

| | | | |
|---|---|---|---|
| 4,292,651 | 9/1981 | Kretz et al. | 375/27 |
| 4,783,792 | 11/1988 | Akagiri et al. | 375/27 |
| 4,805,017 | 2/1989 | Kaneko et al. | 358/136 |
| 4,837,618 | 6/1989 | Hatori et al. | 358/135 |
| 4,894,713 | 1/1990 | Delogne et al. | 358/135 |

Primary Examiner—Stephen Chin
Attorney, Agent, or Firm—Ostrolenk, Faber, Gerb & Soffen

[57] ABSTRACT

In an encoding device for transforming a sequence of digital image signals into a sequence of transformed signals which is subjected to interframe predictive coding by the use of a subtracter and a local decoding loop, the subtracter supplies a block judgement circuit with a sequence of error signals divided into a sequence of blocks. The block judgement circuit judges whether each block is a significant block or a less significant block to produce significant and less significant block signals, respectively. The local decoding loop is selectively put into normal and specific modes in response to the significant and the less significant block signals, respectively. In the normal mode, an inverse transform circuit and a local transform circuit are normally operated through a frame memory in the local decoding loop by producing a sequence of inverse transformed signals and a sequence of local decoded signal, respectively. In the specific mode, the inverse transform and the local transform circuits are bypassed when the less significant block signal is produced by the block judgement circuit. Alternatively, the frame memory may be controlled by a write-in controller supplied with the significant and the less significant block signals. Similar operation is carried out in a decoding device.

10 Claims, 5 Drawing Sheets

5,046,071

COMMUNICATION SYSTEM CAPABLE OF IMPROVING TRANSMISSION EFFICIENCY BY CLASSIFYING A BLOCK SEQUENCE INTO SIGNIFICANT AND LESS SIGNIFICANT BLOCKS

BACKGROUND OF THE INVENTION

This invention relates to a communication system which carries out code transform as forward transform on a sequence of input samples in an encoding device so as to enable high efficiency coding and which carries out inverse code transform in a decoding device.

A conventional communication system of the type described comprises an encoding device which is supplied as a sequence of input samples with a sequence of digital image signals and which subjects the digital image signals to code transform, such as DCT (discrete cosine transform) or the like, by the use of a code transform circuit to internally produce a sequence of code transformed signals. After the code transform, the code transformed signals are very often subjected to interframe predictive coding to produce a sequence of error signals and is thereafter sent to a decoding device as a sequence of output digital signals. More specifically, the encoding device comprises a subtracter supplied with the code transformed signals and a sequence of local decoded signals sent through a local decoding loop. The subtracter calculates differences between the code transformed signals and the local decoded signals and produces the error signals representative of the differences. The error signals are sent from the encoding device to the decoding device as the output digital signals on one hand and are locally decoded by the local decoding loop into the local decoded signals on the other hand. Within the local decoding loop, the error signals are subjected to inverse code transform by the use of an inverse code transform circuit and thereafter locally subjected to the code transform in a manner similar to that of the code converter.

Thus, the inverse code transform and the local code transform are always executed in the local decoding loop with a predetermined precision which is finite. In other words, transform errors inevitably occur during such inverse code transform and local code transform in dependency upon the precision and are successively accumulated with time.

It is to be noted that the code transform, such as the orthogonal transform, is usually carried out by dividing the input samples into sample blocks each of which is composed of at least one input sample. In addition, the input samples or the digital image signals carry or convey not only a moving image but also a stationary image. This shows that the sample blocks can be classified into a moving image block and a stationary image block.

When the stationary image block is subjected to the interframe predictive coding, only less significant coded data signals have to be used during the interframe predictive coding and may not be sent from the encoding device to a decoding device. In other words, significant coded data signals have to appear during the interframe predictive coding of only the moving image block. Thus, high efficiency coding becomes possible to favorably reduce an amount of information to be sent to the decoding device if the stationary and the moving image blocks could separately be processed. From this fact, it is readily understood that the stationary and the moving image blocks may be judged as a less significant block and a significant block.

However, less significant coded data signals may be wrongly transmitted to the decoding device when the transform errors are accumulated due to the finite precision of the code transform and the inverse code transform. Such wrong transmission of the less significant coded data signals results in an increase of an amount of information to be transmitted and brings about a reduction of data transmission efficiency.

SUMMARY OF THE INVENTION

It is an object of this invention to provide a communication system which can increase data transmission efficiency.

It is another object of this invention to provide an encoding device which is for use in the above-mentioned communication system and which can produce a sequence of output digital signals without wrong transmission of less significant coded data signals.

It is still another object of this invention to provide a decoding device which is for use in the communication system mentioned above and which can favorably decode the output digital signal sequence.

An encoding device to which this invention is applicable is for encoding a sequence of input samples into a sequence of output digital signals. The encoding device comprises forward transform means for carrying out predetermined code transform on the input samples to produce a sequence of transformed code signals and subtracting means responsive to the transformed code signal sequence and a sequence of local decoded signals for calculating differences between the transformed code signals and the local decoded signals to produce a sequence of error signals which are representative of the differences and which are divided into a sequence of blocks. Each block is composed of at least one of the error signals. The encoding device comprises quantizing means coupled to the error signal sequence for quantizing the error signal sequence into a sequence of quantized signals, output means coupled to the quantizing means for producing the quantized signal sequence as the output digital signal sequence, local decoding means coupled to the quantizing means for carrying out local decoding operation of the quantized signal sequence to produce a sequence of local output signals, and signal supply means coupled to the local decoding means and the subtracting means for supplying the local output signal sequence to the subtracter means as the locally decoded signal sequence. According to this invention, the encoding device further comprises classifying means coupled to the subtracting means for classifying each of the blocks into a significant block and a less significant block to produce significant and less significant block signals representative of the significant and the less significant blocks, respectively, and operation control means coupled to the classifying means and the local decoding means for controlling the local decoding operation to put the local decoding means into a normal mode in response to the significant block signal and to put the local decoding means into a specific mode different from the normal mode in response to the less significant block signal.

DESCRIPTION OF THE PREFERRED EMBODIMENTS

Figure 1:
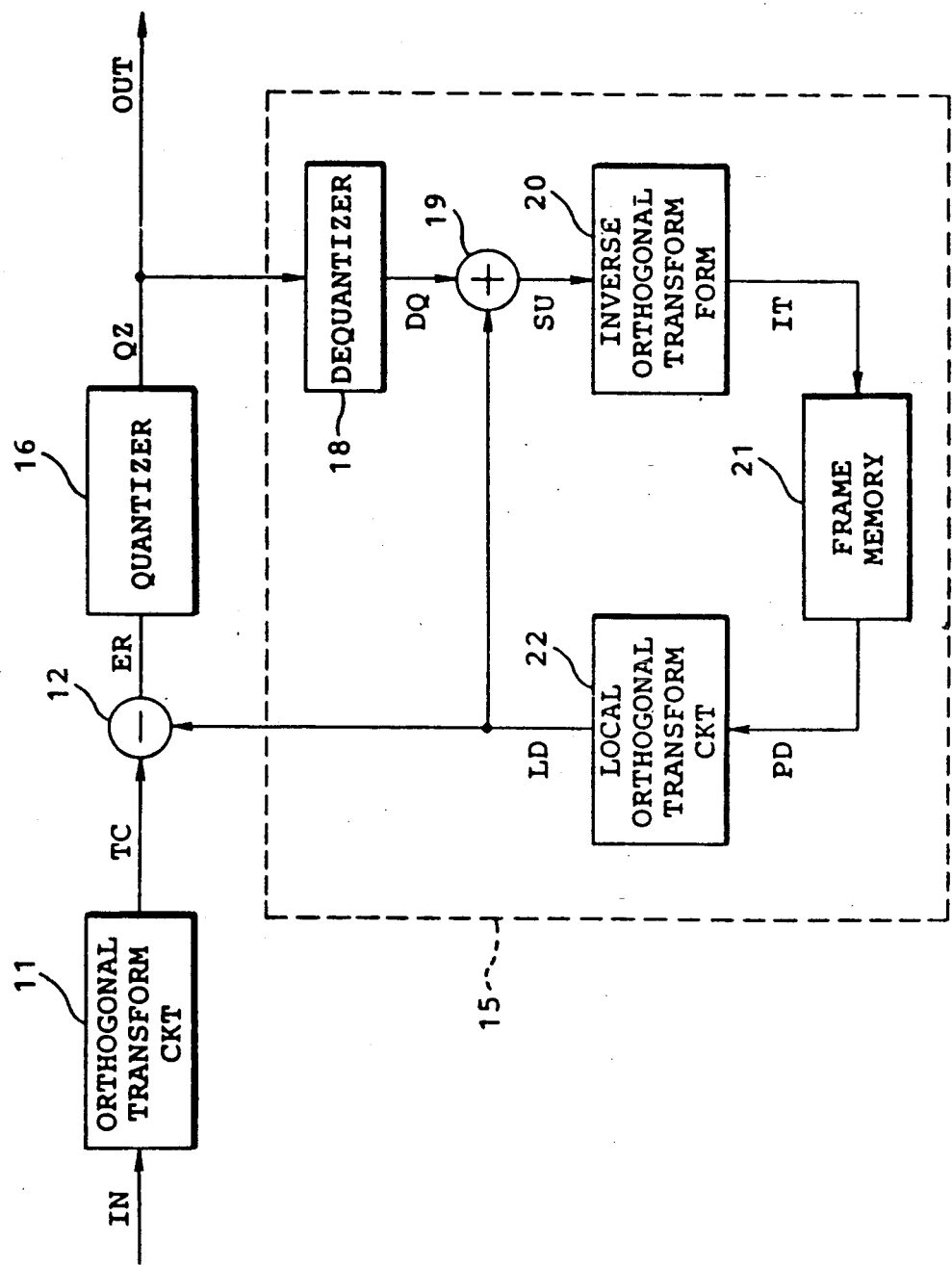
FIG. 1 is a block diagram of a conventional encoding device.

Referring to FIG. 1, description will be made as regards a conventional encoding device which is supplied as a sequence of samples with a sequence of digital image signals IN. It is assumed that the illustrated encoding device carries out interframe predictive coding. The digital image signals IN are formed by a sequence of frames and given to an orthogonal transform circuit 11. Anyway, the digital image signals IN are subjected to orthogonal transform by the orthogonal transform circuit 11 and are transformed into a sequence of transformed code signals TC which is divided into code blocks. In this event, the orthogonal transform circuit 11 may be referred to as a forward transform circuit. More specifically, the orthogonal transform circuit 11 comprises a memory for successively memorizing the digital image signals IN, an access control circuit for accessing the memory to read memorized digital image signals out of the memory at every one of the code blocks, and a transform circuit for transforming the memorized digital image signals of each code block into the transformed code signals TC. The transformed code signals TC are in one-to-one correspondence to the input samples or digital image signals IN.

A subtracter 12 is supplied with the transformed code signals TC and a sequence of local decoded signals LD sent from a local decoding loop 15 which will be described later in detail. Anyway, the subtracter 12 calculates differences between the transformed code signals TC and the local decoded signals LD to produce a sequence of error signals ER which is representative of the differences and which is divided into a sequence of error signal blocks. Each of the error signal blocks corresponds to each of the code blocks and is composed of at least one of the error signals ER. Each error signal block may correspond to, for example, eight by eight input samples IN and may be often simply called a block. The error signals ER are quantized by a quantizer 16 into a sequence of quantized signals QZ which is produced as a sequence of output digital signals and which is delivered to a dequantizer 18 of the local decoding loop 15.

The dequantizer 18 dequantizes the quantized signals QZ into a sequence of dequantized signals DQ which is sent to an adder 19 supplied with the local decoded signals LD. The adder 19 adds the dequantized signals DQ to the local decoded signals LD to send a sequence of sum signals SU to an inverse orthogonal transform circuit 20. The inverse orthogonal transform circuit 20 carries out inverse orthogonal transform of the sum signals SU into a sequence of inverse transformed signals IT which is divisible into the frames and which is successively memorized as a sequence of write-in signals into a frame memory 21 at every frame of the inverse transformed signals IT. The inverse transformed signals IT are successively read out of the frame memory 21 as a sequence of readout signals. The readout signal sequence can correspond to predictive values of the digital image signals IN and will be referred to as a sequence of predictive signals PD. Supplied with the predictive signals PD, a local orthogonal transform circuit 22 carries out orthogonal transform of the predictive signals PD to produce a sequence of code transformed predictive signals representative of predictive values of the transformed code signals TC. The code transformed predictive signals are sent to the subtracter 12 as the local decoded signals LD.

Thus, the digital image signals are subjected to the orthogonal transform by the orthogonal transform circuit 11 and thereafter to interframe predictive coding at every block by the local decoding loop 15. The inverse orthogonal transform and the local orthogonal transform are always carried out within the local decoding loop 15 with a finite precision. Therefore, transform errors are accumulated with time, which reduces transmission efficiency, as described in the preamble of the instant specification.

Figure 2:
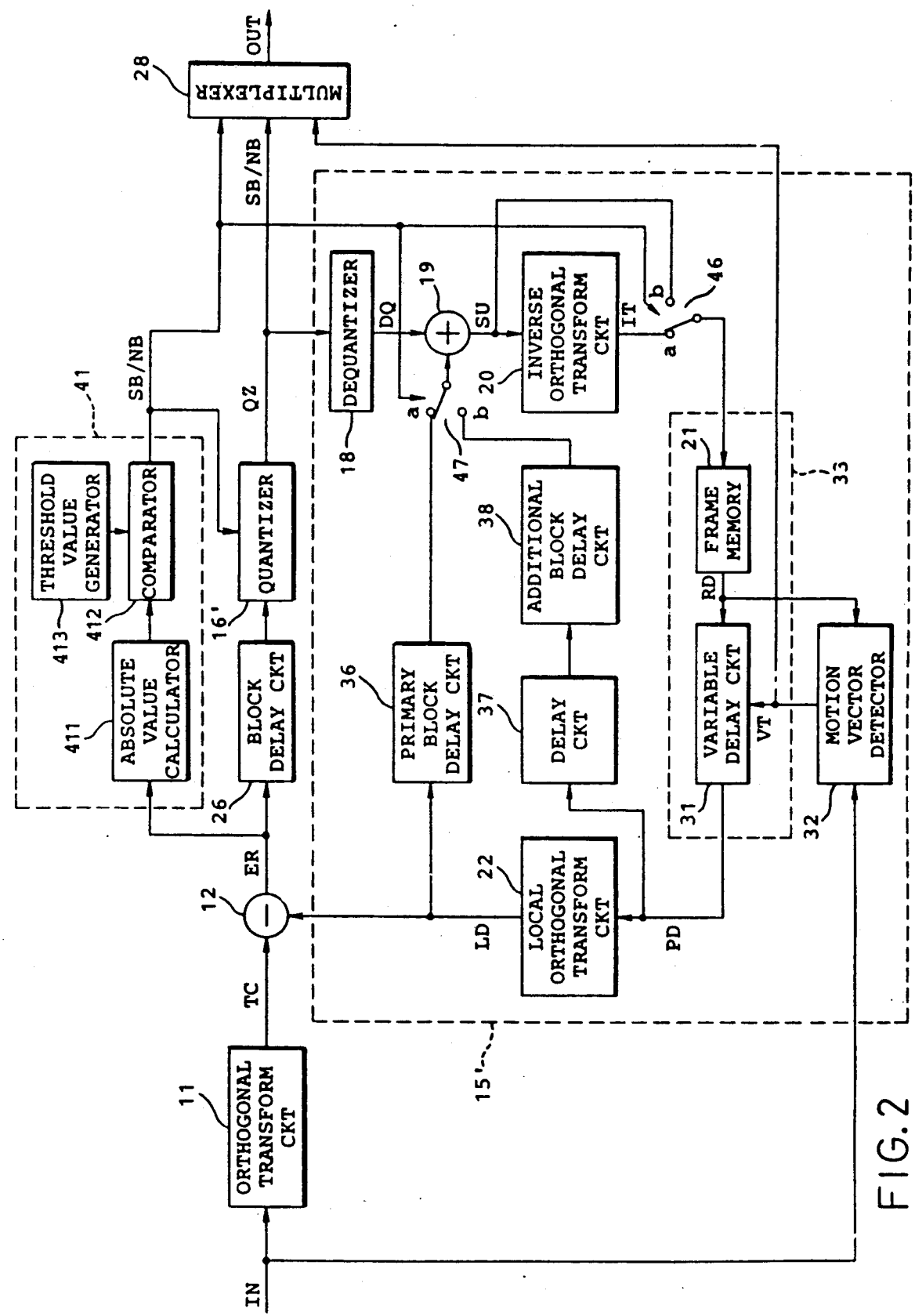
FIG. 2 is a block diagram of an encoding device according to a first embodiment of this invention.

Referring to FIG. 2, an encoding device according to a first embodiment of this invention comprises similar parts designated by like reference numerals. The digital image signals IN are supplied to the orthogonal transform circuit 11 like in FIG. 1 and also to a local decoding loop 15' in the example being illustrated. The digital image signals IN are processed by the local decoding loop 15' in a manner to be described later.

The digital image signals IN are subjected to the orthogonal transform and subtraction by the forward orthogonal transform circuit 11 and the subtracter 12 in the manner illustrated in FIG. 1 and are produced from the subtracter 12 as the error signals ER.

In the example being illustrated, the error signals ER are sent to a controllable quantizer 16' through a block delay circuit 26 having a delay time equal to a single block time during which a single block lasts. A combination of the block delay circuit 26 and the controllable quantizer 16' may be called a quantizing circuit for quantizing the error signals ER into the quantized signals QZ.

As a result, the controllable quantizer 16' is supplied with the error signals ER delayed by the single block time to quantize the delayed error signals ER into a sequence of quantized signals QZ in a manner to be described later. The quantized signals QZ are produced through a multiplexer 28 as the output digital signals depicted at OUT on one hand and are delivered to the local decoding loop 15' on the other hand.

The illustrated local decoding loop 15' is operable in a normal mode and a specific mode different from the normal mode. In the normal mode, the local decoding loop 15' carries out normal local decoding operation and produces a sequence of local decoded signals LD in a manner similar to that illustrated in FIG. 1 while the local decoding loop 15' carries out local decoding operation different from the normal local decoding operation in the specific mode.

Specifically, the local decoding loop 15' comprises the dequantizer 18, the adder 19, the inverse orthogonal transform circuit 20, and the local orthogonal transform circuit 22 like in FIG. 1.

In addition, the illustrated frame memory 21 is combined with a variable delay circuit 31 and a motion vector detector 32 to form a motion compensation circuit for compensating for a motion in the digital image signals IN in a known manner. To this end, the digital image signals IN are supplied to the motion vector detector 32 together with the readout signals read out of the frame memory 21.

Herein, it is to be noted that the digital image signals IN are derived from a current frame while the readout signals are derived from a frame preceding the current frame. The motion vector detector 32 compares the digital image signals IN of the current frame with the readout signals RD of the preceding frame at every block to check whether or not they have patterns matched with each other and to calculate motion vectors which are delivered as motion vector signals VT to both the variable delay circuit 31 and the multiplexer 28. Operation of the motion vector detector 32 is known in the art and therefore will not be described any longer hereinunder. The variable delay circuit 31 delays the readout signals RD in accordance with the motion vector signals VT to produce a sequence of delayed readout signals as a sequence of predictive signals PD. Such a combination of the frame memory 21 and the variable delay circuit 31 may be collectively called a local memory circuit 33.

The predictive signals PD are sent to the local orthogonal transform circuit 22. The illustrated local orthogonal transform circuit 22 supplies the local decoded signals LD not only to the subtracter 12 but also to a primary block delay circuit 36 which produces primary block delayed signals. In addition, the predictive signals PD are also sent to a delay circuit 37 having a delay substantially equal to that of the local orthogonal transform circuit 22. This means that the delay circuit 37 serves to compensate for the delay which takes place in the local orthogonal transform circuit 22 and supplies delayed predictive signals to an additional block delay circuit 38. The additional block delay circuit 38 has a delay equal to the single block time and produces additional block delayed predictive signals.

Further referring to FIG. 2, the illustrated encoding device further comprises a block judgement circuit 41 supplied with the error signals ER at every one of the error signal blocks to judge whether each error signal block is a significant block or a less significant block and to produce a significant block signal SB and a less significant block signal NB representative of the significant and the less significant blocks, respectively. In other words, the block judgement circuit 41 is operable to classify each error signal block into either one of the significant and the less significant blocks and may therefore be referred to as a classifying circuit. The significant and the less significant blocks may be called a valid block and an invalid block, respectively. In order to carry out the above-mentioned judgement, the block judgement circuit 41 comprises an absolute value calculator 411 for calculating a sum of absolute values of the error signals ER in each error signal block. Specifically, the error signal block is composed of, for example, sixty-four error signals ER of which the absolute values are summed up in the absolute value calculator 411. The absolute values are sent to a comparator 412 supplied with a predetermined threshold value from a threshold value generator 413. The predetermined threshold value is determined in dependency upon a quantization characteristic of the controllable quantizer 16' and may be empirically decided by an operator. At any rate, the comparator 412 compares the absolute values with the predetermined threshold value to produce the significant block signal SB and the less significant block signal NB when the absolute values exceed and do not exceed the predetermined threshold value, respectively. Each of the significant and the less significant block signals SB and NB lasts for the single error signal block.

The significant and the less significant block signals SB and NB are delivered to the controllable quantizer 16' and the multiplexer 28. The controllable quantizer 16' carries out quantization of the delayed error signals in response to the significant block signal SB. Consequently, the delayed error signals are quantized into the quantized signals QZ like in FIG. 1. On the other hand, the controllable quantizer 16' stops quantization of the delayed error signals in response to the less significant block signal NB and produces a series of zeroes during the error signal block indicated by the less significant block signal NB. The significant and the less significant block signals SB and NB are produced through the multiplexer 28 as a part of the output digital signals OUT together with the quantized signals QZ and the motion vector signals VT, as mentioned above.

In FIG. 2, the significant and the less significant block signals SB and NB are delivered to the local decoding loop 15' to put the same into the normal and the specific modes, respectively. Specifically, the significant and the less significant block signals SB and NB are sent to first and second switches 46 and 47 arranged in the local decoding loop 15'. The first switch 46 is intermediate between the inverse orthogonal transform circuit 20 and the frame memory 21 and has first and second contacts (depicted at a and b) which are connected to the inverse orthogonal transform circuit 20 and the adder 19, respectively.

The second switch 47 is intermediate between the adder 19 and both the primary and the additional block delay circuits 36 and 38 and has first and second contacts (depicted at a and b) connected to the primary and the additional block delay circuits 36 and 38, respectively. Each of the first and the second switches 46 and 47 selects the first and the second contacts a and b in response to the significant block signal SB and the less significant block signal NB to put the local decoding loop into the normal and the specific modes, respectively.

Let the significant block signal SB be delivered to the first and the second switches 46 and 47 as a result of detection of the significant block. In this event, the inverse orthogonal transform circuit 20 is connected to the frame memory 21 through the first switch 46 while the adder 19 is connected to the local orthogonal transform circuit 22 through the primary block delay circuit 36. The frame memory 21 is supplied with the inverse transformed signals IT from the inverse orthogonal transform circuit 20 while the adder 19 is supplied as internal signals with the primary block delayed signals from the local orthogonal transform circuit 22 through the primary block delay circuit 36 and the second switch 47. In this situation, operation is carried out in the local decoding loop 15' in the normal mode described in conjunction with FIG. 1.

On the other hand, let the less significant block signal NB be delivered from the block judgement circuit 41 to the first and the second switches 46 and 47 as a result of detection of the less significant block. In this case, the local decoding loop 15' is put into the specific mode. In the specific mode, the first and the second switches 46 and 47 are switched from the first contacts a to the second contacts b. Therefore, the inverse orthogonal transform circuit 20 is disconnected from the frame memory 21 by the first switch 46 while the adder 19 is directly connected to the frame memory 21 through the first switch 46. In this connection, the sum signals SU are sent to the frame memory 21 and are memorized into the frame memory 21 as memorization signals. This shows that the inverse orthogonal transform circuit 20 is bypassed and that none of the inverse transformed signals IT are not memorized as the write-in signals into the frame memory 21 during the less significant block. Instead, the frame memory 21 memorizes as the write-in signals the sum signals which are calculated during a previous significant block preceding the less significant block in question.

Likewise, the adder 19 is supplied as the internal signals with the additional block delayed signals from the variable delay circuit 31 through the delay circuit 37 and the additional block delay circuit 38 through the second switch 47. In this event, the additional block delayed signals are not subjected to the local orthogonal transform by the local orthogonal transform circuit 22 and are formed by the predictive signals PD calculated during the previous significant block. The predictive signals PD are also sent to the local orthogonal transform circuit 22 to be locally transformed to be sent as the local decoded signals LD to the subtracter 12.

From this fact, it is readily understood that the first and the second switches 46 and 47 serve to control local decoding operation in the local decoding loop 15' and may be referred to as an operation control circuit for controlling the local decoding operation in response to the significant and the less significant block signals SB and NB.

Thus, the quantized signals QZ, the significant block signals SB or the less significant block signals NB, and the motion vector signals VT are multiplexed by the multiplexer 28 into the output digital signals OUT. At any rate, it is possible with this structure to avoid transmission of information on the less significant block and to therefore improve data transmission efficiency.

Figure 3:
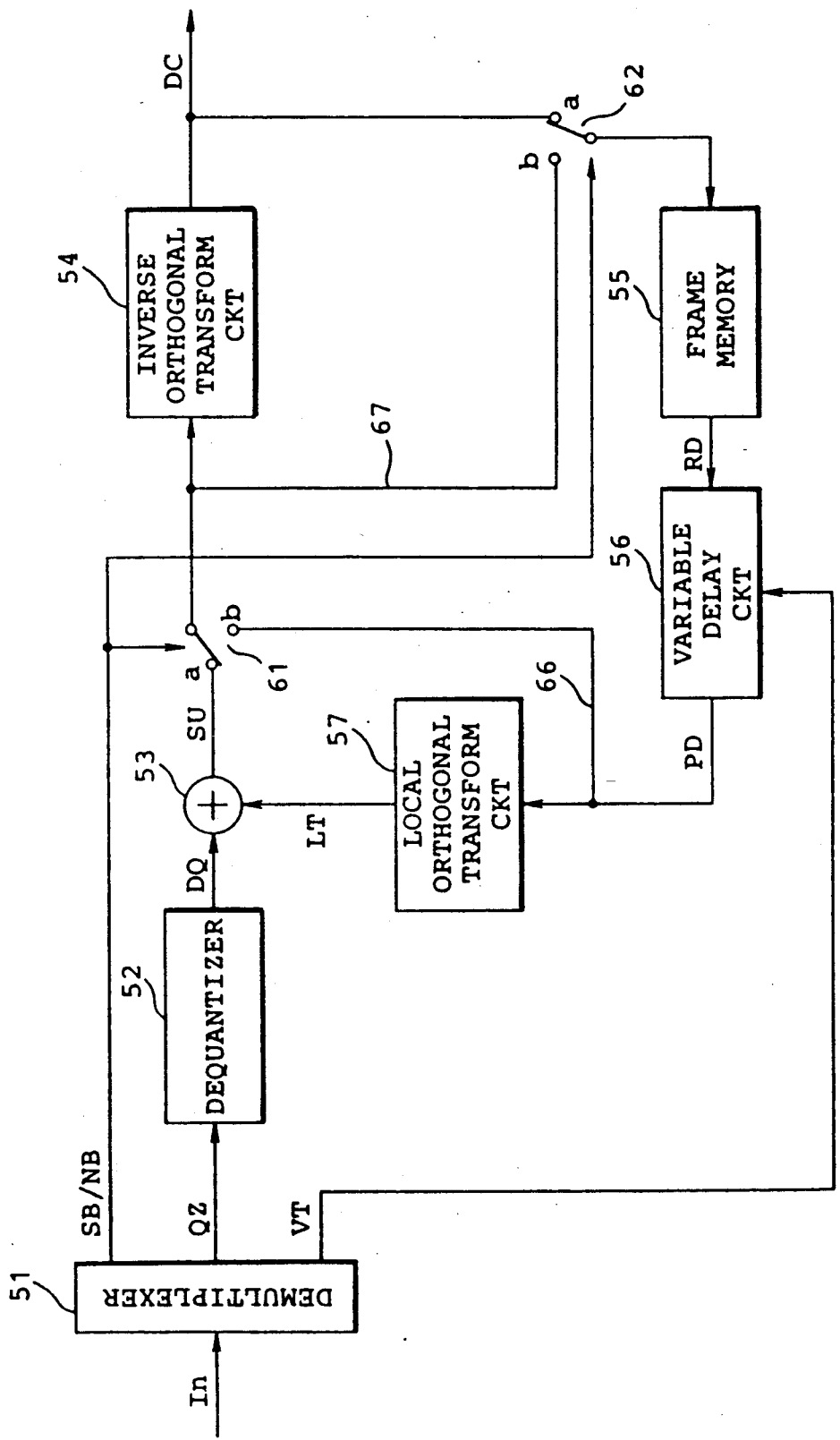
FIG. 3 is a block diagram of a decoding device which is communicable with the encoding device illustrated in FIG. 2.

Referring to FIG. 3, a decoding device is communicable with the encoding device illustrated in FIG. 2 and is supplied as a sequence of input signals In with the output digital signals OUT mentioned in conjunction with FIG. 2. The decoding device comprises a demultiplexer 51 which demultiplexes the input signals In into quantized signals QZ, motion vector signals VT, and significant or less significant block signals SB/NB all of which are reproductions of the corresponding signals described in conjunction with FIG. 2. The illustrated decoding device comprises a dequantizer 52, an adder 53, an inverse orthogonal transform circuit 54, a frame memory 55, a variable delay circuit 56, and an orthogonal transform circuit 57 which are similar in operation and structure to those illustrated in the corresponding elements of FIG. 2.

In the example being illustrated, the quantized signals QZ are delivered from the demultiplexer 51 to the dequantizer 52 while the motion vector signals VT are sent from the demultiplexer 51 to the variable delay circuit 56. The dequantizer 52 dequantizes the quantized signals QZ into a sequence of decoder dequantized signals DQ which is added by the adder 53 to a sequence of locally transformed signals LT. A sequence of sum signals is produced by the adder 53 as a result of sums of the decoder dequantized signals DQ and the locally transformed signals LT.

On the other hand, the motion vector signals VT are supplied to the variable delay circuit 56 which is connected to the frame memory 55 in which a sequence of write-in signals is memorized in a manner to be described later. The write-in signals are read out of the frame memory 55 and are delayed by the variable delay circuit 56 in accordance with the motion vector signals VT. A sequence of readout signals RD is read out of the frame memory 55 and is subjected to motion compensation by the variable delay circuit 56 to be produced as a sequence of motion compensated signals PD. The motion compensated signals PD are sent from the variable delay circuit 56 to the local orthogonal transform circuit 57.

It is to be noted here that first and second decoder switches 61 and 62 are intermediate between the adder 53 and the inverse orthogonal transform circuit 54 and between the inverse orthogonal transform circuit 54 and the frame memory 55, respectively, and are controlled by the significant and the less significant block signals SB and NB. More specifically, each of the first and the second decoder switches 61 and 62 has a first contact a and a second contact b like the first and the second switches 46 and 47. The first and the second contacts a and b are selected in each of the first and the second decoder switches 61 and 62 in response to the significant and the less significant block signals SB and NB, respectively.

When the significant block signal SB is given to the first and the second decoder switches 61 and 62, the first decoder switch 61 connects the adder 53 to the inverse orthogonal transform circuit 54 while the second decoder switch 62 connects the inverse orthogonal transform circuit 54 to the frame memory 55, as illustrated in FIG. 3. Therefore, the sum signals SU are decoded by the inverse orthogonal transform circuit 54 into a sequence of decoded signals DC which are reproductions of the input samples IN (FIG. 2). This state may be called a normal decoding state.

On the other hand, when the less significant block signals NB are given to the first and the second decoder switches 61 and 62, the local orthogonal transform circuit 57 and the inverse orthogonal transform circuit 54 are bypassed by first and second connections 66 and 67 connected to the second contacts b of the first and the second decoder switches 61 and 62. In this situation, the frame memory 55 memorizes as the write-in signals the motion compensated signals PD derived from a previous significant block preceding the less significant block in question. This state may be called a specific decoding state.

Figure 4:
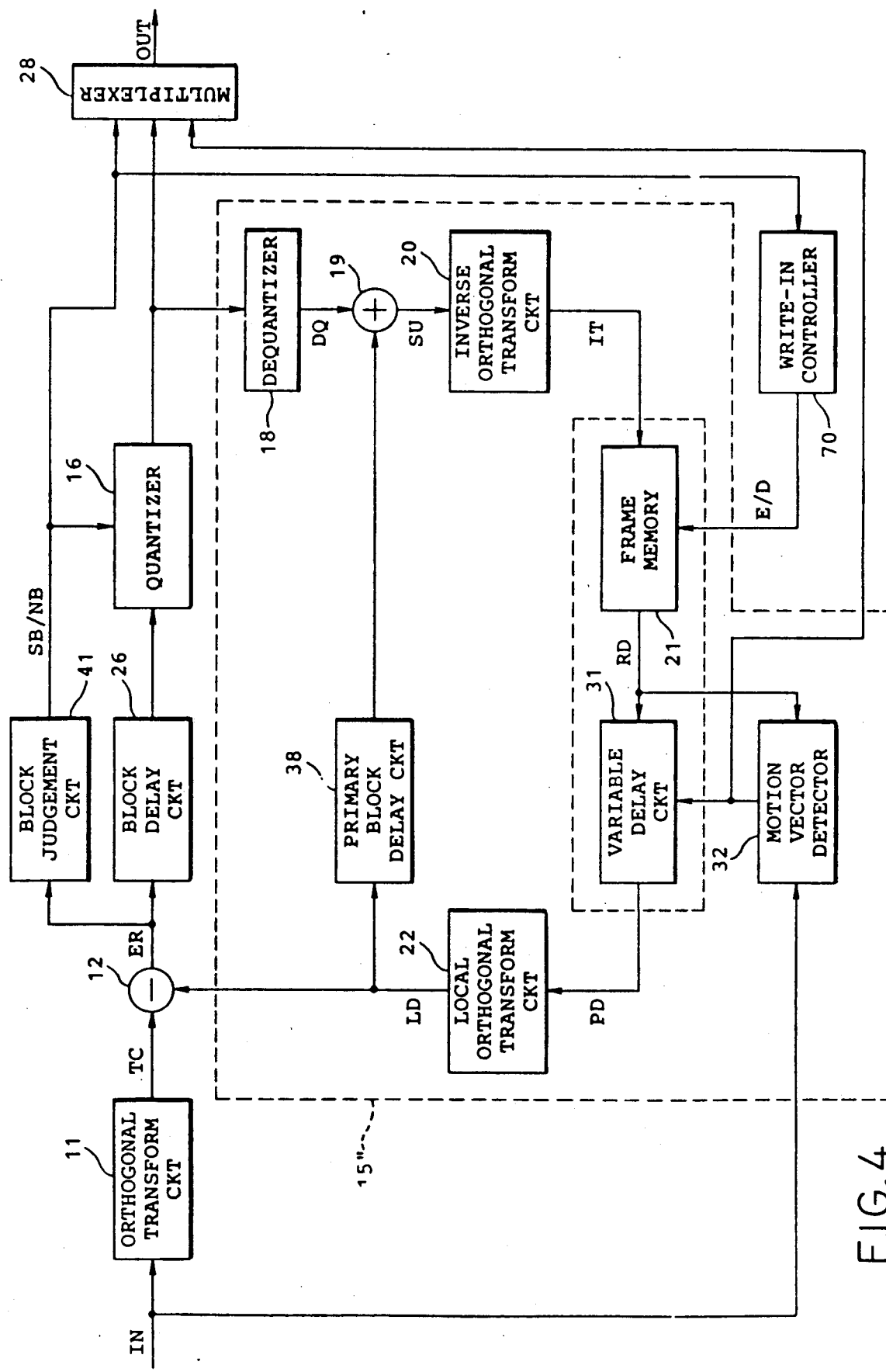
FIG. 4 is a block diagram of an encoding device according to a second embodiment of this invention.

Referring to FIG. 4, an encoding device according to a second embodiment of this invention is similar to that illustrated in FIG. 2 except that the encoding device (FIG. 4) comprises a write-in controller 70 selectively supplied with the significant and the less significant block signals SB and NB and that the first and the second switches 46 and 47 and the delay circuit 35 and the additional block delay circuit 36 (FIG. 2) are removed from the encoding device illustrated in FIG. 4. The write-in controller 70 illustrated in FIG. 4 controls a write-in operation of the frame memory 21 in response to the significant and the less significant block signals SB and NB. Specifically, the write-in controller 70 supplies an enable signal E to the frame memory 21 in response to the significant block signal SB to write the inverse orthogonal transformed signals IT into the frame memory 21. On the other hand, the write-in controller 70 supplies a disable signal D to the frame memory 21 to inhibit write-in operation of the frame memory 21. During a readout operation of a less significant block, the frame memory 55 produces the inverse orthogonal transformed signals IT which are calculated in relation to a previous significant block preceding the less significant block.

Figure 5:
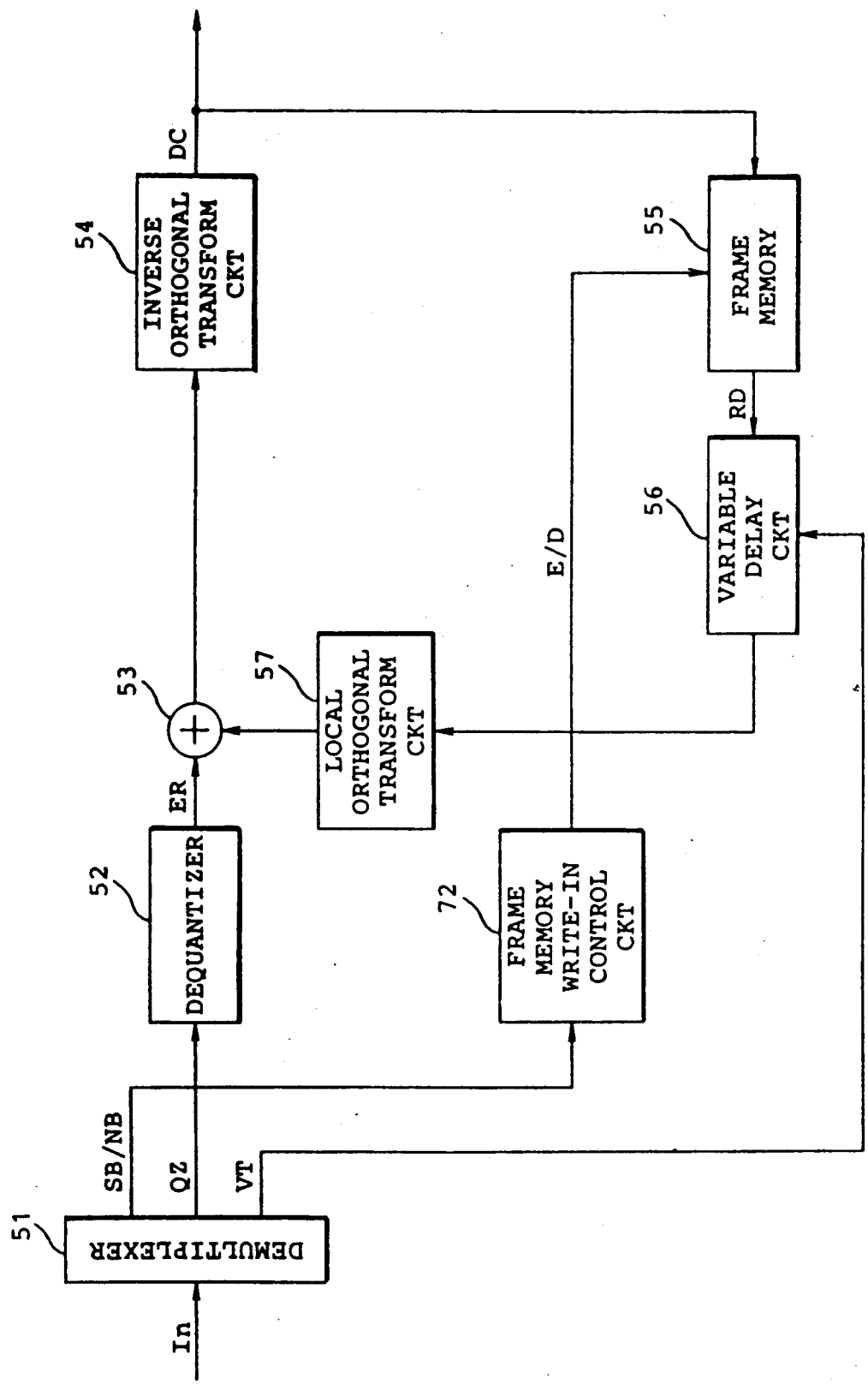
FIG. 5 is a block diagram of a decoding device which is communicable with the encoding device illustrated in FIG. 4.

Referring to FIG. 5, a decoding device is communicable with the encoding device illustrated in FIG. 4 and is similar in structure to that illustrated in FIG. 3 except that a frame memory write-in control circuit 72 is substituted for the first and the second decoder switches 61 and 62 (FIG. 3). The frame memory write-in control circuit 72 is similar in operation to that illustrated in FIG. 4 and is selectively supplied with the significant and the less significant block signals SB and NB to produce, as a write-in control signal, a write-in enable signal E and a write-in disable signal D, respectively. Supplied with the write-in enable signal E, the frame memory 55 is allowed to write the decoded signals DC therein as the write-in signals. In other words, the frame memory write-in control circuit 72 makes the frame memory 55 write the decoded signals DC by delivering the enable signal E to the frame memory 55 in the normal decoding state.

On the other hand, the frame memory 55 stops the write-in operation of the decoded signals DC when the decoding device is put into the specific decoding state in response to the disable signal D. In other words, the write-in operation is inhibited in the frame memory 55 when the disable signal D is supplied from the frame memory write-in control circuit 72 to the frame memory 55. During a readout operation of a less significant block, the frame memory 55 produces, as the readout signals RD, the decoded signals DC of a previous significant block preceding the less significant block. The readout signals are sent through the variable delay circuit 56 to the local orthogonal transform circuit 57 to be subjected to the orthogonal transform.

From this fact, it is understood that transform errors are not accumulated with time in the above-mentioned communication system because the frame memory is not loaded with data signals which are subjected to the orthogonal transform or the inverse orthogonal transform during the less significant blocks. This shows that it is possible to considerably reduce a possibility that the less significant blocks are wrongly judged as significant blocks. In addition, transmission efficiency is remarkably improved because the less significant blocks are accurately judged by the encoding and the decoding devices.

While this invention has thus far been described in conjunction with a few embodiments thereof, it will readily be possible for those skilled in the art to put this invention into practice in various other manners. For example, code transform may be Hadamard transform or the like, although the description is restricted to the orthogonal transform. In addition, the input samples IN may not be restricted to digital image signals but any other digital data signals.

What is claimed is:

1. An encoding device for encoding a sequence of input samples into a sequence of output digital signals, said encoding device comprising forward transform means for carrying out predetermined code transform on said input samples to produce a sequence of transformed code signals, subtracting means responsive to said transformed code signals and a sequence of local decoded signals for calculating differences between said transformed code signals and said local decoded signals to produce a sequence of error signals which are representative of said differences and which are divided into a sequence of blocks, each being composed of at least one of said error signals, quantizing means responsive to said error signals for quantizing said error signals into a sequence of quantized signals, local decoding means coupled to said quantizing means for carrying out local decoding operation of said quantized signals to produce said local decoded signals, and signal supply means coupled to said local decoding means and to said subtracting means for supplying said local decoded signals to said subtracting means as said local decoded signals, said encoding device further comprising:

classifying means coupled to said subtracting means for classifying each of said blocks into a significant block and a less significant block to produce significant and less significant block signals representative of said significant and said less significant blocks, respectively;

multiplexing means coupled to said quantizing means and said classifying means for multiplexing said quantized signals and said significant and said less significant block signals into said output digital signals; and operation control means coupled to said classifying means and said local decoding means for controlling said local decoding operation to put said local decoding means into a normal mode in response to said significant block signal and to put said local decoding means into a specific mode different from said normal mode in response to said less significant block signal.

2. An encoding device comprising:

a first orthogonal transform circuit responsive to a sequence of input samples for carrying out orthogonal transform of said input samples into a sequence of transformed code signals;

a subtracter responsive to said transformed code signals and a sequence of local decoded signals for calculating differences between said transformed code signals and said local decoded signals to produce a sequence of error signals which are representative of said differences and which are divided into a sequence of blocks, each being composed of at least one of said error signals;

a quantizer for quantizing said error signals sequence into a sequence of quantized signals;

a dequantizer for dequantizing said quantized signal sequence into a sequence of dequantized signals;

an adder responsive to said dequantized signals and a sequence of internal signals for adding said dequantized signals to said internal signals to produce a sequence of sum signals;

an inverse orthogonal transform circuit for carrying out inverse orthogonal transform on said sum signals to produce a sequence of inverse transformed signals;

a memory for selectively memorizing said inverse transformed signals to produce a sequence of memory output signals;

a second orthogonal transform circuit connected to said memory for locally carrying out the orthogonal transform on said memory output signals to produce said sequence of local decoded signals;

judging means responsive to said error signals for judging whether each block is a significant block or a less significant block, to selectively produce a significant block signal and a less significant block signal representative of said significant and said less significant blocks, respectively; and operation control means coupled to said judging means for controlling said inverse orthogonal transform circuit and said second orthogonal transform circuit to put said inverse orthogonal transform and said othogonal transform circuits into a normal mode of supplying said inverse transformed signals and said local decoded signals to said memory and said adder in response to said significant block signal, respectively, and, otherwise, to put said inverse orthogonal transform circuit and said second orthogonal transform circuit into a specific mode different from said normal mode.

3. An encoding device for encoding a sequence of input samples into a sequence of output digital signals, said encoding device comprising:

forward transform means for carrying out predetermined code transform on said input samples to produce a sequence of transformed code signals;

subtracting means responsive to said transformed code signals and a sequence of local decoded signals for calculating differences between said transformed code signals and said local encoded signals to produce a sequence of error signals which are representative of said differences and which are divided into a sequence of blocks, each being composed of at least one of said error signals;

quantizing means responsive to said error signals for quantizing said error signals into a sequence of quantized signals;

local decoding means coupled to said quantizing means for carrying out local decoding operation of said quantized signals to produce said local decoded signals, said local decoding means comprising dequantizing means coupled to said quantizing means for dequantizing said quantized signal sequence into a sequence of dequantized signals, adder means for adding said dequantized signal sequence to a sequence of internal signals to produce a sequence of sum signals each of which is representative of a sum of said dequantized and said internal signals, inverse code transform means responsive to said sum signals for carrying out, on said sum signals, inverse code transform inverse to said predetermined code transform to produce a sequence of inverse transformed signals, memory means for memorizing a sequence of write-in signals to produce a sequence of predictive signals predictive of said input samples, and local code transform means for locally carrying out the predetermined code transform on said predictive signals to produce a sequence of code transformed predictive signals as said local decoded signal;

signal supply means coupled to said local decoding means and said subtracting means for supplying said sequence of local decoded signals;

classifying means coupled to said subtracting means for classifying each of said blocks into a significant block and a less significant block to produce significant and less significant block signals representative of said significant and said less significant blocks, respectively;

multiplexing means coupled to said quantizing means and said classifying means for multiplexing said quantized signals and said significant and said less significant block signals into said output digital signals; and operation control means coupled to said classifying means and said local decoding means for controlling said local decoding operation to put said local decoding means into a normal mode in response to said significant block signal and to put said local decoding means into a specific mode different from said normal mode in response to said less significant block signal, said operation control means comprising:

first selecting means coupled to said inverse code transform means and said adder means and to said classifying means for selecting said inverse transformed signals and said sum signals in response to said significant and said less significant block signals to put said local decoding means into said normal and said specific modes, respectively, to produce a selected one of said inverse transformed signals and said sum signals as said write-in signals; and second selecting means coupled to said memory means and said local code transform means and to said classifying means, for selecting said predictive signals and said code transformed predictive signals in response to said significant and said less significant block signals to put said local decoding means into said normal and said specific modes, respectively, to produce a selected one of said predictive signals and said code transformed predictive signals as said internal signals.

4. A decoding device communicable with the encoding device claimed in claim 3, said decoding device comprising:

demultiplexing means supplied as a sequence of input signals with said output digital signals for demultiplexing said input signals into reproductions of the quantized signals and the significant and the less significant block signals;

decoder dequantizing means for dequantizing said reproductions of the quantized signals into a sequence of decoder dequantized signals;

decoder adder means responsive to said decoder dequantized signals and a sequence of decoder local signals for adding said decoder dequantized signals to said decoder local signals to produce a sequence of decoder sum signals representative of sums of said decoder dequantized signals and said decoder local signals;

decoder inverse transform means responsive to said decoder sum signals for carrying out inverse transform on said decoder sum signals to produce a sequence of decoder decoded signals;

decoder memory means for memorizing a sequence of decoder write-in signals to produce a sequence of decoder readout signals;

decoder local transform means for carrying out local transform on said decoder readout signals to produce a sequence of decoder locally transformed signals;

means for supplying said decoder locally transformed signals as said decoder local signals to said decoder adder means;

decoder control means responsive to the reproductions of said significant and said less significant block signals for controlling said decoder inverse transform means and said decoder local transform means to put said decoder inverse transform means and said decoder local transform means into a normal decoding state of carrying out said inverse transform on said decoder sum signals and said local transform on said decoder read-out signals in response to said significant block signals and to put said decoder inverse transform means and said decoder local transform means into a specific decoding state different from said normal decoding state in response to the reproduction of said less significant block signal, respectively.

5. A decoding device as claimed in claim 4, wherein said decoder control means comprises:

first supplying means coupled to said decoder adder means, said decoder inverse transform means, and said decoder local transform means and selectively supplied with the reproductions of said significant and said less significant block signals for supplying said decoder sum signals to said decoder inverse transform means when the reproduction of said significant block signal is given to said first supplying means, and otherwise, for separating said decoder local transform means from said decoder adder means during said less significant block to put said decoder local transformer means into said specific decoding state; and second supplying means coupled to said decoder inverse transform means, said decoder memory means, and said decoder adder means and responsive to the reproductions of said significant and said less significant block signals for supplying said decoder decoded signals to said decoder memory means when said significant block signal is given to said second supplying means, and otherwise, for separating said decoder memory means from said inverse transform means to put said decoder inverse transform means into said specific decoding state.

6. A decoding device as claimed in claim 5, wherein said decoder control means comprises:

decoder write-in control means responsive to the reproductions of said significant block signal and said less significant block signal for controlling a decoder write-in operation of said decoder memory means to make said decoder memory means memorize said decoder decoded signals in response to said significant block signal and to disable said decoder memory means in response to said less significant block signal.

7. An encoding device for encoding a sequence of input samples into a sequence of output digital signals, said encoding device comprising:

forward transform means for carrying out predetermined code transform on said input samples to produce a sequence of transformed code signals;

subtracting means responsive to said transformed code signals and a sequence of local decoded signals for calculating differences between said transformed code signals and said local encoded signals to produce a sequence of error signals which are representative of said differences and which are divided into a sequence of blocks, each being composed of at least one of said error signals;

quantizing means responsive to said error signals for quantizing said error signals into a sequence of quantized signals;

local decoding means coupled to said quantizing means for carrying out local decoding operation of said quantized signals to produce said local decoded signals, said local decoding means comprising dequantizing means coupled to said quantizing means for dequantizing said quantized signal sequence into a sequence of dequantized signals, adder means for adding said dequantized signal sequence to a sequence of internal signals to produce a sequence of sum signals each of which is representative of a sum of said dequantized and said internal signals, inverse transforming means responsive to said sum signals for carrying out, on said sum signals, inverse code transform inverse to said predetermined code transform to produce a sequence of inverse transformed signals, memory means for memorizing a sequence of write-in signals to produce a sequence of predictive signals predictive of said input samples, and local code transform means for locally carrying out the predetermined code transform on said predictive signals to produce a sequence of code transformed predictive signals as said local decoded signals;

signal supply means coupled to said local decoding means and said subtracting means for supplying said sequence of local decoded signals;

classifying means coupled to said subtracting means for classifying each of said blocks into a significant block and a less significant block to produce significant and less significant block signals representative of said significant and said less significant blocks, respectively;

multiplexing means coupled to said quantizing means and said classifying means for multiplexing said quantized signals and said significant and said less significant block signals into said output digital signals; and operation control means coupled to said classifying means and said local decoding means for controlling said local decoding operation to put said local decoding means into a normal mode in response to said significant block signal and to put said local decoding means into a specific mode different from said normal mode in response to said less significant block signal, said operation control means comprising:

memory control means coupled to said classifying means and said memory means for controlling said memory means to write said inverse transformed signals into said memory means only when said significant block signal is given from said classifying means to said memory control means and, otherwise, not to write said code transformed signals into said memory means.

8. A decoding device communicable with the encoding device claimed in claim 7, said decoding device comprising:

demultiplexing means supplied as a sequence of input signals with said output digital signals for demultiplexing said input signals into reproductions of the quantized signals and the significant and the less significant block signals;

decoder dequantizing means for dequantizing said reproductions of the quantized signals into a sequence of decoder dequantized signals;

decoder adder means responsive to said decoder dequantized signals and a sequence of decoder local signals for adding said decoder dequantized signals to said decoder local signals to produce a sequence of decoder sum signals representative of sums of said decoder dequantized signals and said decoder local signals;

decoder inverse transform means responsive to said decoder sum signals for carrying out inverse transform on said decoder sum signals to produce a sequence of decoder decoded signals;

decoder memory means for memorizing a sequence of decoder write-in signals to produce a sequence of decoder readout signals;

decoder local transform means for carrying out local transform on said decoder readout signals to produce a sequence of decoder locally transformed signals;

means for supplying said decoder locally transformed signals as said decoder local signals to said decoder adder means;

decoder control means responsive to the reproductions of said significant and said less significant block signals for controlling said decoder inverse transform means and said decoder local transform means to put said decoder inverse transform means and said decoder local transform means into a normal decoding state of carrying out said inverse transform on said decoder sum signals and said local transform on said decoder decoded read-out signals in response to said significant block signals and to put said decoder inverse transform means on said decoder local transform means into a specific decoding state different from said normal decoding state in response to the reproduction of said less significant block signal, respectively.

9. A decoding device as claimed in claim 8, wherein said decoder control means comprises:

first supplying means coupled to said decoder adder means, said decoder inverse transform means, and said decoder local transform means and selectively supplied with the reproductions of said significant and said less significant block signals for supplying said decoder sum signals to said decoder inverse transform means when the reproduction of said significant block signal is given to said first supplying means, and otherwise, for separating said decoder local transform means from said decoder adder means during said less significant block to put said decoder local transformer means into said specific decoding state; and second supplying means coupled to said decoder inverse transform means, said decoder memory means, and said decoder adder means and responsive to the reproductions of said significant and said less significant block signals for supplying said decoder decoded signals to said decoder memory means when said significant block signal is given to said second supplying means, and otherwise, for separating said decoder memory means from said inverse transform means to put said decoder inverse transform means into said specific decoding state.

10. A decoding device as claimed in claim 9, wherein said decoder control means comprises:

decoder write-in control means responsive to the reproductions of said significant block signal and said less significant block signal for controlling a decoder write-in operation of said decoder memory means to make said decoder memory means memorize said decoder decoded signals in response to said significant block signal and to disable said decoder memory means in response to said less significant block signal.

* * * * *